(12) United States Patent (10) Patent No.: US 8,928,330 B2
Kim et al. (45) Date of Patent: Jan. 6, 2015

(54) APPRATUS FOR MEASURING GROUND LEAKAGE CURRENT IN AN UNGROUNDED DIRECT CURRENT POWER SYSTEM, AND METHOD FOR SAME

(75) Inventors: Young-Chul Kim, Seoul (KR); Soon-Suk Kim, Gangdong-gu (KR)

(73) Assignee: Weal Electro Co., Ltd, Seoul (KR)

( * ) Notice: Subject to any disclaimer, the term of this patent is extended or adjusted under 35 U.S.C. 154(b) by 622 days.

(21) Appl. No.: 13/234,631

(22) Filed: Sep. 16, 2011

(65) Prior Publication Data

US 2012/0025840 A1 Feb. 2, 2012

Related U.S. Application Data

(63) Continuation of application No. PCT/KR2010/001457, filed on Mar. 9, 2010.

(30) Foreign Application Priority Data

Mar. 16, 2009 (KR) .......................... 10-2009-0021958

(51) Int. Cl.
  *G01R 31/02* (2006.01)
(52) U.S. Cl.
  CPC .................................. *G01R 31/025* (2013.01)
  USPC ........................................................ 324/509
(58) Field of Classification Search
  CPC .............................................. G01R 31/025
  USPC ......................................................... 324/509
  See application file for complete search history.

(56) References Cited

U.S. PATENT DOCUMENTS

| 4,739,275 | A | * | 4/1988 | Kimball et al. | 324/529 |
| 5,363,047 | A | * | 11/1994 | Dresti et al. | 324/510 |
| 6,907,363 | B1 | * | 6/2005 | Wyant et al. | 702/65 |
| 7,477,058 | B2 | * | 1/2009 | Montreuil | 324/522 |
| 2005/0001607 | A1 | * | 1/2005 | Berland et al. | 324/67 |
| 2006/0119997 | A1 | * | 6/2006 | Lee | 361/42 |

FOREIGN PATENT DOCUMENTS

| JP | 2005-164419 | 6/2005 |
| JP | 2008-164374 | 7/2008 |
| JP | 2008-164375 | 7/2008 |
| KR | 1020080062382 | 7/2008 |
| KR | 1020080071259 | 8/2008 |

OTHER PUBLICATIONS

Xing, C., et al., Analysis and Research of Automatic testing Accuracy of Insulation Resistance of Ship Cables, Journal of Naval University of Engineering, Apr. 2002, pp. 25-28, vol. 14, No. 2, China.

* cited by examiner

*Primary Examiner* — Jeff Natalini

(74) *Attorney, Agent, or Firm* — IP & T Group LLP

(57) ABSTRACT

A ground leakage current measurement apparatus in an ungrounded DC power system including positive and negative electric lines includes a switching unit configured to perform switching to supply measurement power to a positive side ground resistor and a negative side ground resistor by using power of the electric lines; a measurement unit connected between the switching unit and the ground and configured to measure at least one of positive and negative side ground leakage currents; and a control unit configured to control the switching unit to discriminate a positive side ground leakage current operation and a negative side ground leakage current operation of the measurement unit.

6 Claims, 12 Drawing Sheets ns
APPRATUS FOR MEASURING GROUND LEAKAGE CURRENT IN AN UNGROUNDED DIRECT CURRENT POWER SYSTEM, AND METHOD FOR SAME

CROSS-REFERENCE TO RELATED APPLICATIONS

This application is a continuation of PCT/KR2010/001457 filed on Mar. 9, 2010, which claims priority of Korean patent application number 10-2009-0021958 filed on Mar. 16, 2009. The disclosure of each of the foregoing applications is incorporated herein by reference in its entirety.

BACKGROUND OF THE INVENTION

The present invention relates to technology for measuring a ground leakage current in an ungrounded DC (Direct Current) power system, and more particularly, to a ground leakage current measurement apparatus and method, which is capable of smoothly measuring ground leakage currents at both sides although a ground fault simultaneously occurs in positive and negative electric lines in a live wire state or ground faults having the same ground resistance simultaneously occur.

In an ungrounded DC power system, an apparatus for measuring a ground leakage current of an electric line in a live wire state is mainly used for alarming a ground fault and installed in a main power booth. Furthermore, a ground resistance measuring instrument may be installed in the main power booth.

In general, a ground fault alarm circuit employs a voltage divider circuit system using two resistors R1 and R2 as shown in FIG. 1 (hereinafter, referred to as '2R system'), and a ground resistance measuring circuit employs a system for generating a measurement voltage by using two Zener diodes ZD1 and ZD2 as shown in FIG. 2 (hereinafter, referred to as '2ZD system').

Both systems will be described more specifically as follows. First, a case in which ground faults having the same ground resistance value occur in both electric lines may be considered in the 2R system. In this case, a divided voltage across both ground fault alarms V1 and V2 for detecting a displacement voltage is not changed in the 2R system. Therefore, the ground fault alarm circuit cannot be operated.

Furthermore, a case in which ground faults having different ground resistance values occur in both electric lines may be considered in the 2R system. In this case, since a ground potential is decided by parallel combined resistance values R1//RG1 and R2//RG2 in the positive and negative sides, alarm operating points of the ground fault alarms V1 and V2 may differ from initial set values. Here, the alarm operating point indicates a critical value which is preset on the assumption that a ground fault occurs only in one electric line.

Furthermore, even when a ground fault occurs only in one electric line in the 2R system, it is impossible to measure a linear displacement voltage depending on variations in ground resistance value. For example, when a positive side ground resistor RG1 varies from 10 kΩ to 20 kΩ in a state in which the resistors R1 and R2 are set to 1 kΩ in FIG. 1, a parallel combined resistance value R1//RG2 in the case of 10 kΩ is about 0.91 kΩ, and a parallel combined resistance value R1//RG2 in the case of 20 kΩ is about 0.95 kΩ. That is, while the value of the ground resistor RG1 doubles, the parallel combined resistance value varies about 1.04 times (0.95/0.91), which means that the variation is non-linear.

Meanwhile, a case in which ground faults having the same ground resistance value occur in both electric lines may be considered in the 2ZD system. When it is assumed that a voltage between the electric lines is 48V, a reference voltage of the Zener diodes ZD1 and ZD2 is 20V, and the ground resistors RG1 and RG2 have the same value, a voltage of 24V is applied to each ground resistor. In this case, a voltage measured by ground leakage current testers A1 and A2 is 4V. Therefore, the ground leakage current testers A1 and A2 measure a different value from an actual ground resistance value.

Furthermore, a case in which ground faults having different ground resistance values occur in both electric lines may be considered in the 2ZD system. At this time, when it is assumed that a voltage between the electric lines is 48V, a reference voltage of the Zener diodes ZD1 and ZD2 is 20V, the ground resistor RG1 has a resistance value of 10 kΩ, and the ground resistor RG2 has a resistance value of 20 kΩ, a voltage across both ends of the ground resistor RG1 is 16V. Therefore, an actually measured voltage is reduced to 4V. Furthermore, since a voltage across both ends of the ground resistor RG2 is 32V, an actually measured voltage becomes a value smaller than zero. Therefore, it is impossible to measure a ground fault in the negative side.

In the 2ZD system, even when a ground fault occurs only in one electric line, for example, in the positive side (RG1=10 kΩ), a current flowing in the ground leakage current tester A1 is 0.4 mA (=4V/10 kΩ). Here, since the reference voltage is 20V, the ground resistance value is measured at 500 kΩ, not 10 kΩ.

Meanwhile, a distributed capacitive component exists between an electric line and the ground, and a capacitive component such as a noise removal capacitor installed in a load exists. As well known, this capacitive component acts as noise during the ground leakage current measurement, and may serve as a cause which makes it difficult to measure an accurate ground resistance value. Furthermore, in order to detect a ground fault position, a method in which a supervisory signal of a signal generator is periodically transmitted to an electric line and a zero phase sequence current transformer (ZCT) installed in a diverging point of the electric line detects a ground leakage current of the diverging point based on the supervisory signal is widely used. When the supervisory signal transmitted to the electric line is a sine wave signal, a capacitive ground leakage current has a phase which leads the phase of a resistive ground leakage current by 90 degrees. When the supervisory signal is a square wave signal, the capacitive ground leakage current exhibits a spike peak. That is, in order to more accurately measure a ground leakage current, the influence of the signal generator as well as the influence of the above-described capacitive components should be removed.

SUMMARY OF THE INVENTION

An embodiment of the present invention is directed to a ground leakage current measurement apparatus and method capable of measuring ground leakage current at both sides, even though ground faults simultaneously occur in positive and negative electric lines.

Another embodiment of the present invention is directed to a ground leakage current measurement apparatus and method capable of measuring a ground leakage current, even though ground faults having the same ground resistance value simultaneously occur in positive and negative electric lines.

Another embodiment of the present invention is directed to a ground leakage current measurement apparatus and method capable of minimizing the influence of capacitive ground leakage current caused by a capacitive component of a load and a distributed capacitive component between an electric line and the ground.

Another embodiment of the present invention is directed to a ground leakage current measurement apparatus and method capable of detecting a ground fault position without using a separate signal generator.

In accordance with an embodiment of the present invention, a ground leakage current measurement apparatus in a ungrounded DC power system including positive and negative electric lines includes: a switching unit configured to perform switching to supply measurement power to a positive side ground resistor and a negative side ground resistor by using power of the electric lines; a measurement unit connected between the switching unit and the ground and configured to measure at least one of positive side and negative side ground leakage currents; and a control unit configured to control the switching unit to discriminate a positive side ground leakage current operation and a negative side ground leakage current operation of the measurement unit.

The switching unit of the ground leakage current measurement apparatus may include a positive side storage section configured to store positive side measurement power from the power of the electric lines; a positive side switching section configured to perform switching to supply the positive side measurement power to the positive side ground resistor; a negative side storage section configured to store negative side measurement power from the power of the electric lines; and a negative side switching section configured to perform switching to supply the negative side measurement power to the negative side ground resistor.

The control unit of the ground leakage current measurement apparatus may control the positive side switching section to supply the positive side measurement power to a load before the positive side ground leakage current measurement operation of the measurement unit, thereby charging a positive side capacitive component of the load.

The control unit of the ground leakage current measurement apparatus may control the negative side switching section to supply the negative side measurement power to a load before the negative side ground leakage current measurement operation of the measurement unit, thereby charging negative side capacitive component of the load.

In accordance with another embodiment of the present invention, a ground leakage current measurement method in an ungrounded DC power system including positive and negative electric lines and a control unit includes: supplying measurement power to a positive side ground resistor or a negative side ground resistor by using power of the electric lines, under control of the control unit; and measuring at least one of positive and negative side ground leakage currents passing through the ground resistor, under control of the control unit which discriminates a measurement operation.

The supplying of the measurement power may include storing positive side measurement power by using the power of the electric lines; and supplying the positive side measurement power to the positive side ground resistor.

The supplying of the measurement power may include storing negative side measurement power by using the power of the electric lines; and supplying the negative measurement power to the negative side ground resistor.

The ground leakage current measurement method may further include supplying the positive side measurement power to a load to charge a positive side capacitive component of the load, before supplying the positive side measurement power to the positive side ground resistor. Furthermore, the ground leakage current measurement method may further include supplying the negative side measurement power to a load to charge a negative side capacitive component of the load, before supplying the negative side measurement power to the negative side ground resistor.

ADVANTAGEOUS EFFECTS

In accordance with the embodiments of the present invention, the positive side ground leakage current measurement operation and the negative side ground leakage current measurement operation are exclusively mutually performed. Therefore, although ground faults simultaneously occur in the positive and negative electric lines or ground faults having the same ground resistance value occur, it is possible to measure ground leakage currents in both sides.

Furthermore, before an actual ground leakage current measurement operation is performed, the capacitive component of the load and the distributed capacitive component between the electric line and the ground are charged. Therefore, the influences of capacitive ground leakage current caused by the capacitive components are minimized. As such, since a pure resistive ground leakage current caused by the ground resistor is measured, it is possible to increase the reliability.

DESCRIPTION OF SPECIFIC EMBODIMENTS

Figure 1:
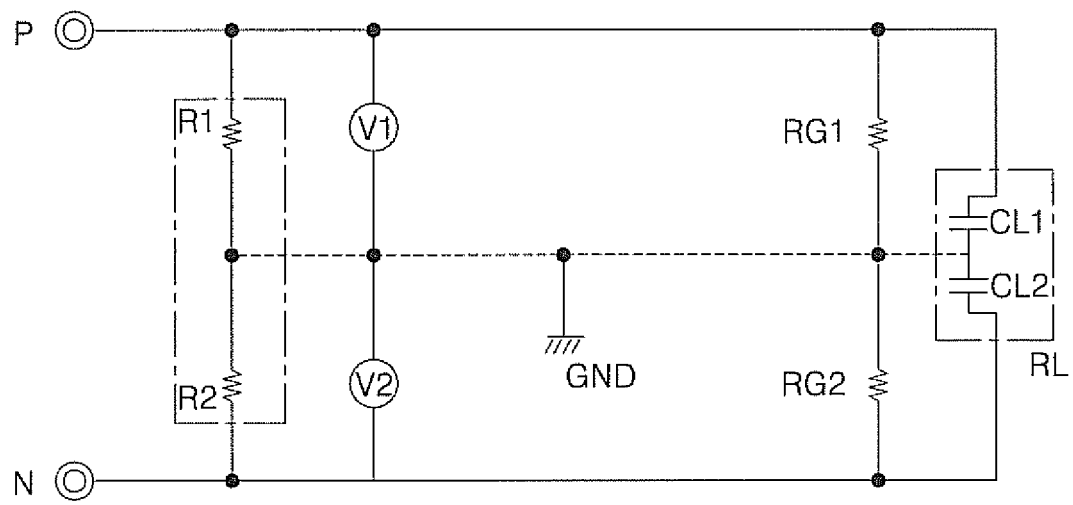
FIG. 1 is a diagram illustrating a schematic circuit configuration of a conventional 2R system.
Figure 2:
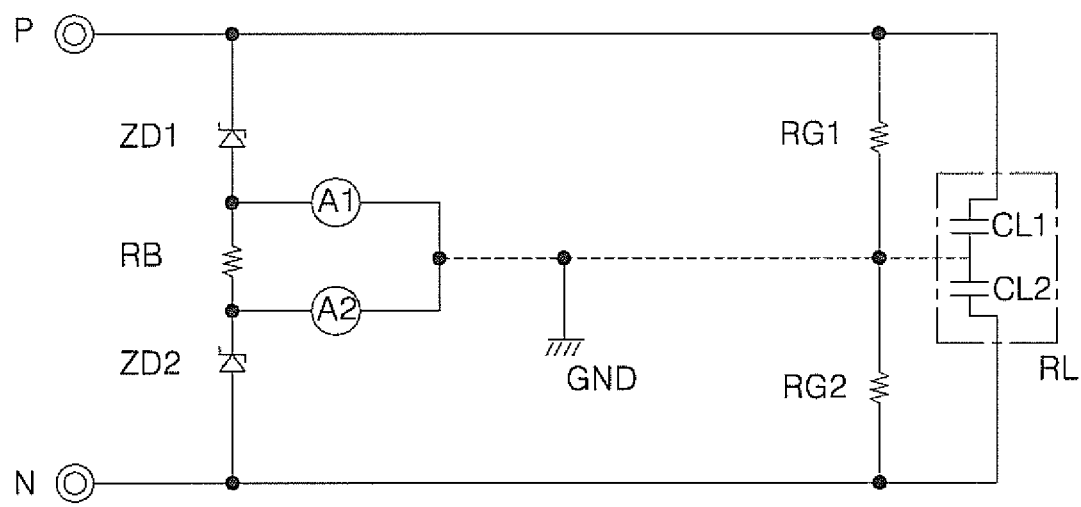
FIG. 2 is a diagram illustrating a schematic circuit configuration of a conventional 2ZD system.

Exemplary embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
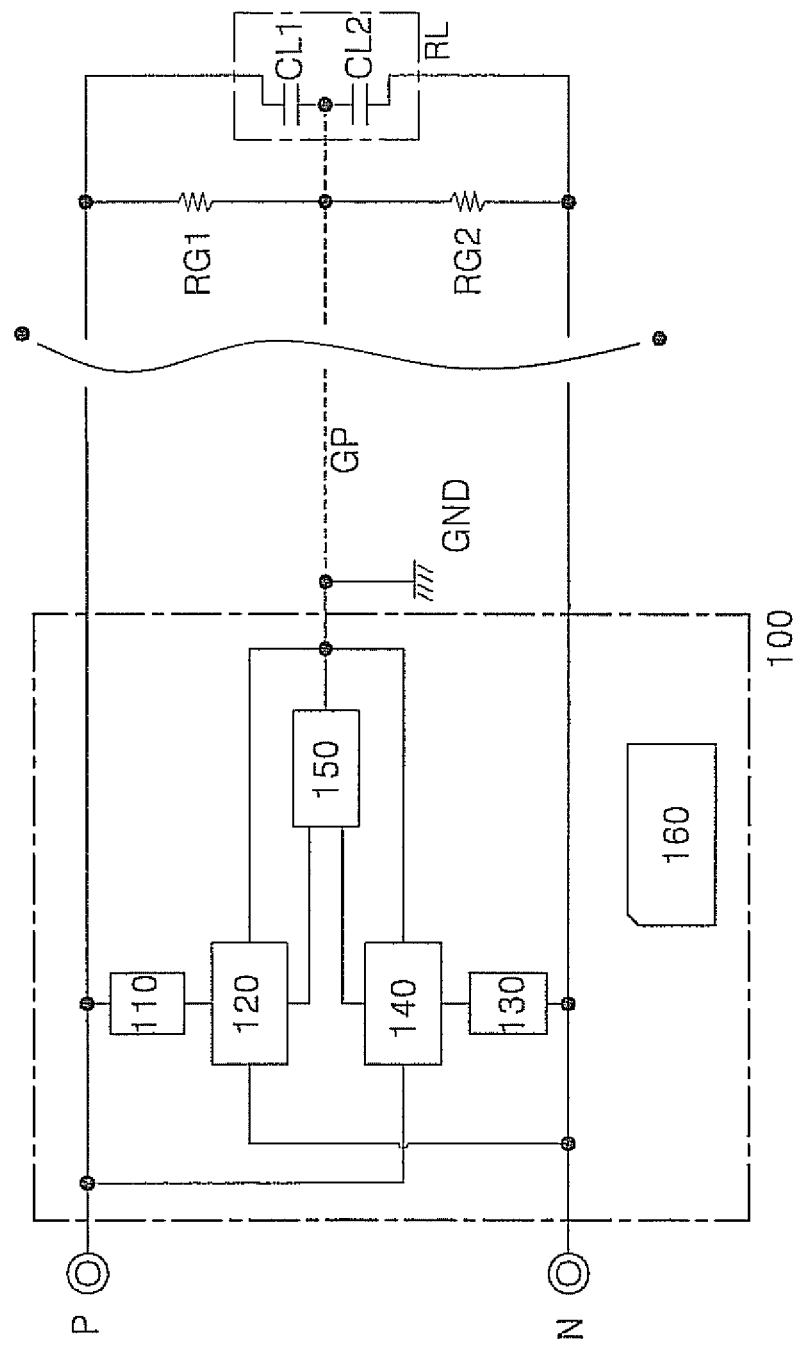
FIG. 3 is a schematic function block diagram of a ground leakage current measurement apparatus in accordance with an embodiment of the present invention.

FIG. 3 is a schematic function block diagram of a ground leakage current measurement apparatus in accordance with an embodiment of the present invention. The ground leakage current measurement apparatus 100 is connected to an ungrounded DC power system consisting of a positive electric line P and a negative electric line N, and includes a positive side storage unit 110, a positive side switching unit 120, a negative side storage unit 130, a negative side switching unit 140, a measurement unit 150, and a control unit 160.

Figure 4:
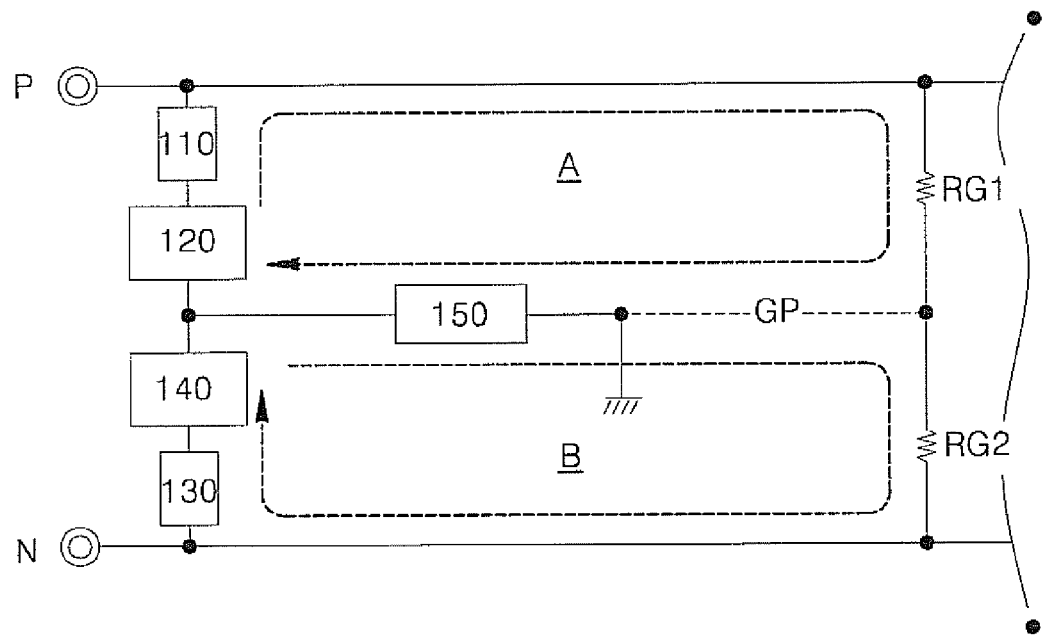
FIG. 4 is a diagram explaining a ground leakage current measurement operation in accordance with the embodiment of the present invention.

In this embodiment of the present invention, 'ground leakage current measurement' is divided into a positive side ground leakage current measurement operation and a negative side ground leakage current measurement operation which are mutually exclusively performed. The concept of each measurement operation may be understood from a closed loop shown in FIG. 4. In FIG. 4, RG1 represents a ground resistor depending on a positive side ground fault (hereinafter, referred to 'positive side ground resistor'), and RG2 represents a negative side resistor depending on a negative side ground fault (hereinafter, referred to as ' negative side ground resistor').

Furthermore, a symbol A represents a closed loop of the positive side storage unit 110 and the positive side switching unit 120→the positive electric line P→the positive side ground resistor RG1→a ground path GP→the measurement unit 150→the positive side storage unit 110 and the positive side switching unit 120, and a symbol B represents a closed loop of the negative side storage unit 130 and the negative side switching unit 140→the measurement unit 150→the ground path GP→the negative side ground resistor RG2→the negative electric line N→the negative side storage unit 130 and the negative side switching unit 140. Here, the ground path GP indicates a path passing through the ground formed between the measurement unit 150 and the ground resistors RG1 and RG2. The closed loops A and B are established only when a ground fault occurs.

Referring to FIG. 3, the positive side storage unit 110 stores power of the electric line, and may include a capacitor (or condenser). The power stored in the positive side storage unit 110 is used for the positive side ground leakage current measurement operation, and hereinafter referred to as 'positive side measurement power'.

The positive side switching unit 120 performs switching to supply the power of the electric line to the positive side storage unit 110 according to a control signal of the control unit 160 to be described below, or desirably, a switching signal indicating ON/OFF. Furthermore, the positive side switching unit 120 performs switching to supply the positive side measurement power of the positive side storage unit 110 to the positive side ground resistor RG1, and the positive side measurement power is supplied to a load RL through the positive electric line P to charge a positive side capacitive component CL1 of the load RL, for example, a noise removal capacitor or the like.

When the positive side capacitive component CL1 of the load RL is charged, most of current of the positive side measurement power is passed toward the positive side ground resistor RG1, during an actual positive side ground leakage current measurement operation. Ideally, all of the current may flow into the positive side ground resistor RG1. Therefore, it is possible to minimize the influence of capacitive ground leakage current caused by the positive side capacitive component CL1 of the load RL and thus measure a pure resistive ground leakage current caused by the positive side ground resistor RG1. Furthermore, as the positive side capacitive component of the load is charged, it is possible to minimize the influence of a distributed capacitive component (not illustrated) between the positive electric line and the ground.

Meanwhile, the negative side storage unit 130 may include a capacitor or condenser, like the positive side storage unit 110, and stores the power of the electric line as negative side measurement power. The negative side measurement power and the above-described positive side measurement power are stored at the same potential as a voltage between the electric lines P and N. For example, when the voltage between the positive and negative electric lines is 48V, the positive side measurement power and the negative side measurement power are also stored at 48V. That is, power required for the positive side and the negative side ground leakage current measurement operation is provided at 48V.

The negative side switching unit 140 performs switching to supply the power of the electric line to the negative side storage unit 130 according to a switching signal of the control unit 160, and performs switching to supply the negative side measurement power stored in the negative side storage unit 130 to the negative side ground resistor RG2, and the negative side measurement power is provided to the load RL through the ground path GP to charge the negative side capacitive component CL2. When the negative side capacitive component CL2 is charged, the current of the negative side measurement power is passed toward the negative side ground resistor RG2 during the negative side ground leakage current measurement operation. This may be understood in the same context as the positive side capacitive component is charged.

The measurement unit 150 is connected between the switching unit 120 and 140 and the ground GND, forms a path to the ground resistors RG1 and RG2 through the ground path GP when a ground fault occurs, and measures a negative side ground leakage current or a positive side ground leakage current. Here, the measurement unit 150 may include a function of calculating a positive side ground resistance value or a negative side ground resistance value from the measured ground leakage current. The embodiment of the present invention is not limited thereto, and the control unit 160 may include the function of calculating a ground resistance value.

The control unit 160 controls the positive side and negative side switching units 120 and 140 based on a switching signal, in order to discriminate the positive side ground leakage current measurement operation and the negative side ground leakage current measurement operation. The detailed descriptions of the function and operation of the control unit 160 will be made below.

Figure 5:
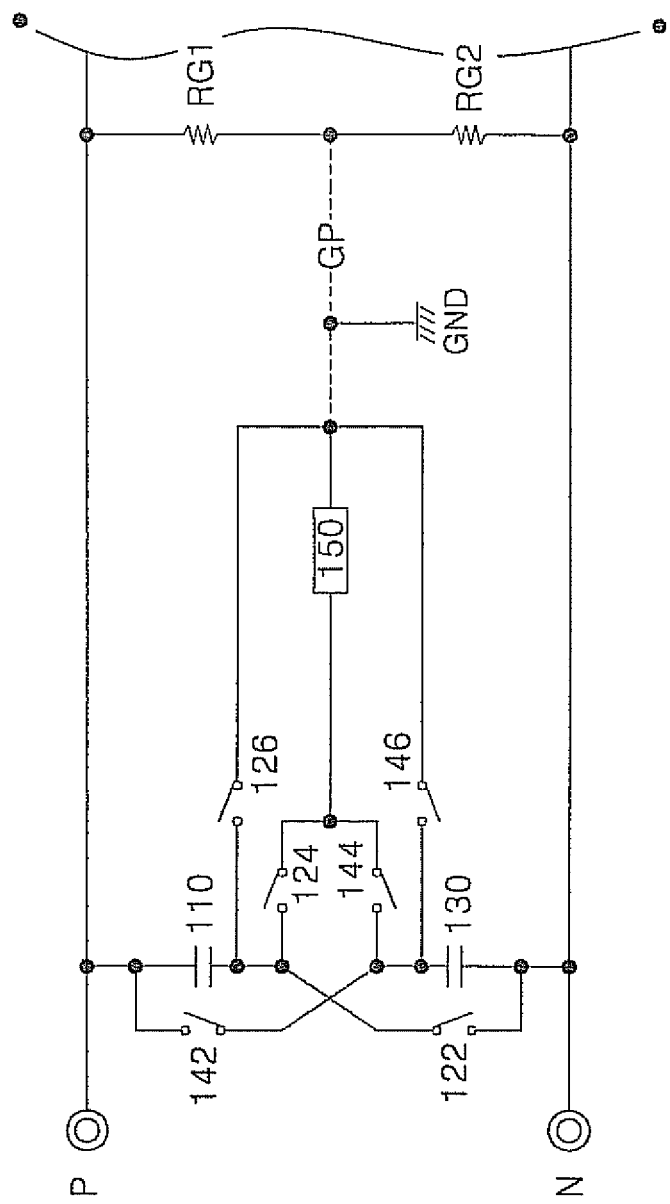
FIG. 5 is a diagram illustrating a circuit configuration of the ground leakage current measurement apparatus in accordance with the embodiment of the present invention.

FIG. 5 is a diagram illustrating a basic circuit configuration of the ground leakage current measurement apparatus. The positive side storage unit 110 has one end connected to the positive electric line P. The above-described switching unit 120 includes a first switch 122, a second switch 124, and a third switch 126. The first switch 122 has one end connected to the negative electric line N and the other end connected to the other end of the positive side storage unit 110, and is switched in response to a switching signal of the control unit 160 to store the positive side measurement power in the positive side storage unit 110. The second switch 124 is connected between the other end of the positive side storage unit 110 and one end of the measurement unit 150 and passes the power of the positive side storage unit 110 to the positive side ground resistor RG1 according to a switching signal. The third switch 126 is connected between the other end of the positive side storage unit 110 and the other end of the measurement unit 150, and supplies the positive measurement power of the positive side storage unit 110 to the load through the positive electric line P according to a switching signal, thereby charging the positive side capacitive component CL1 of the load.

In this specification, the switching unit may include a metal-oxide semiconductor field-effect transistor (MOSFET) having high-voltage and high-current characteristics. However, the embodiment of the present invention is not limited thereto, and a mechanical switch which is switched according to a switching signal (ON/OFF signal) of the control unit may be used.

Meanwhile, the negative side storage unit 130 has one end connected to the negative electric line N. The negative side switching unit 140 includes a fourth switch 142, a fifth switch 144, and a sixth switch 146. The fourth switch 142 has one end connected to the positive electric line P and the other end connected to the other end of the negative side storage unit 130, and stores the negative side measurement power in the negative side storage unit 130 according to a switching signal of the control unit 160. The fifth switch 144 is connected between the other end of the negative side storage unit 130 and the one end of the measurement unit 150, and passes the negative side measurement power of the negative side storage unit 110 to the negative side ground resistor RG2 according to a switching signal. The sixth switch 146 is connected between the other end of the negative side storage unit 130 and the other end of the measurement unit 150, and supplies the negative side measurement power of the negative side storage unit 130 to the load through the ground path GP according to a switching signal, thereby charging the negative side capacitive component CL2 of the load.

Figure 6:
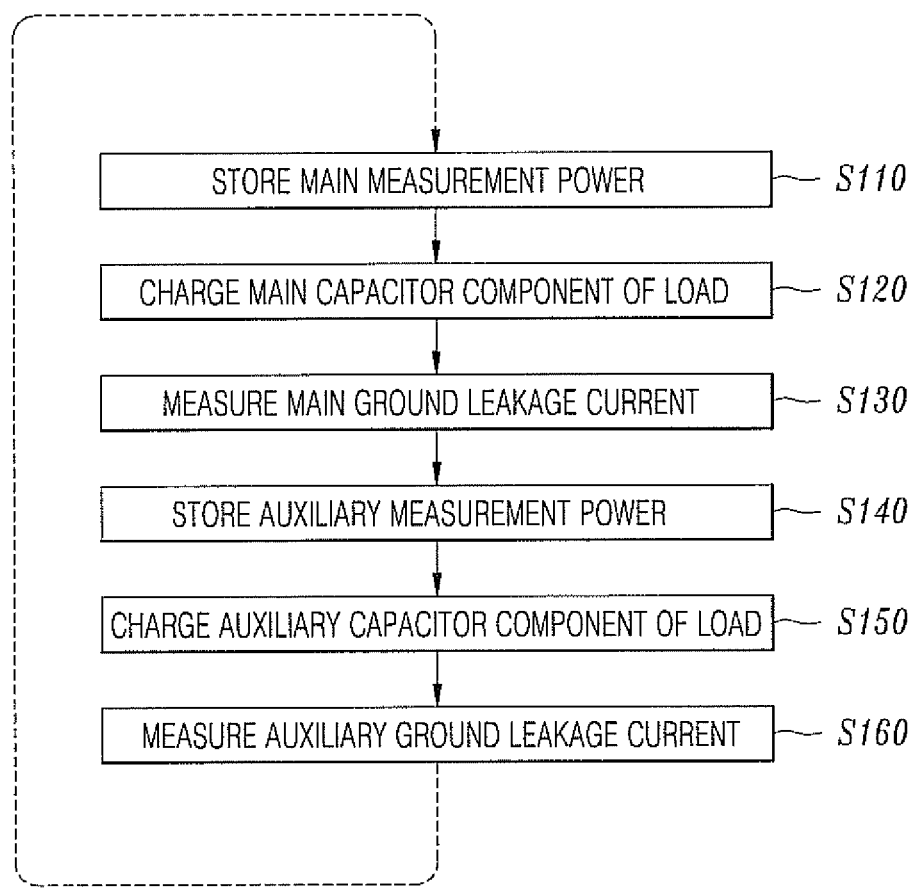
FIG. 6 is a flow chart explaining a ground leakage current measurement process in accordance with another embodiment of the present invention.

Meanwhile, referring to FIG. 6, the ground leakage current measurement process in accordance with the embodiment of the present invention may include: storing the positive side measurement power at step S110, charging the positive side capacitive component of the load at step S120, measuring a positive side ground leakage current at step S130, storing the negative side measurement power at step S140, charging the negative side capacitive component of the load at step S150, and measuring a negative ground leakage current at step S160. Desirably, the steps S110 to S160 may be repetitively performed. Hereinafter, each of the steps will be described with a table showing the on/off states of the respective switches.

[Storing Positive Side Measurement Power—S110]

Figure 7:
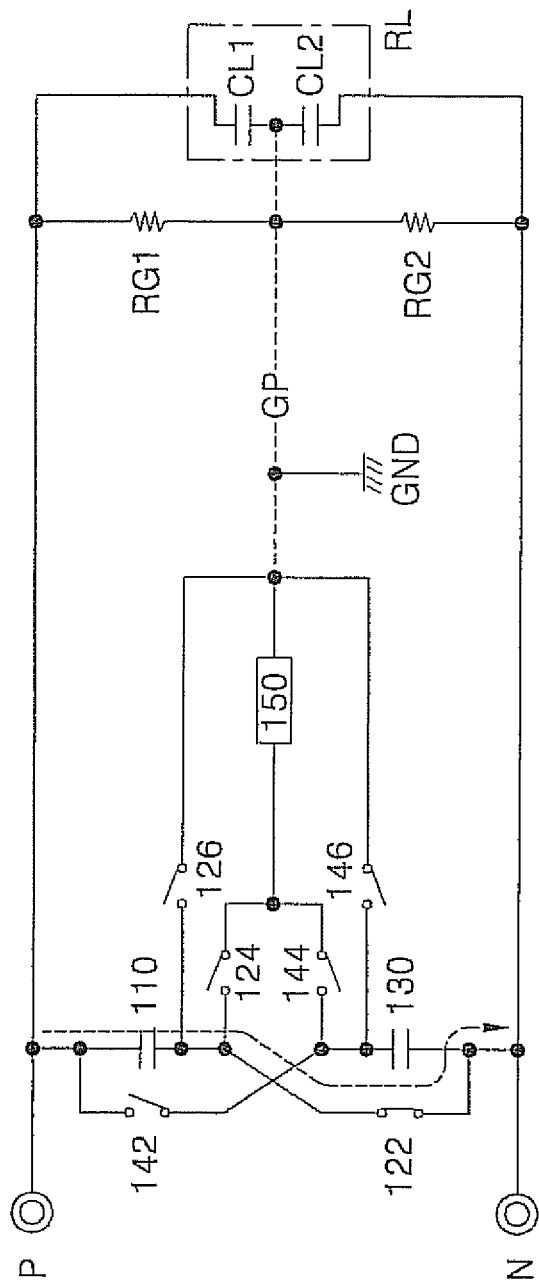
FIG. 7 is a diagram explaining an operation of storing positive side measurement power in accordance with the embodiment of the present invention.

Referring to FIG. 7, the control unit 160 applies a switching signal (not illustrated), that is, an ON signal to the first switch 122 to charge the positive side storage unit 110. The positive side storage unit 110 is charged with a voltage between the positive electric line P and the negative electric line N, and the voltage is used as the positive side measurement power.

TABLE 1

| | Switch | | | | | |
|---|---|---|---|---|---|---|
| | 122 | 124 | 126 | 142 | 144 | 146 |
| State | ON | OFF | OFF | OFF | OFF | OFF |

[Charging Positive Side Capacitive Component of Load—S120]

Figure 8:
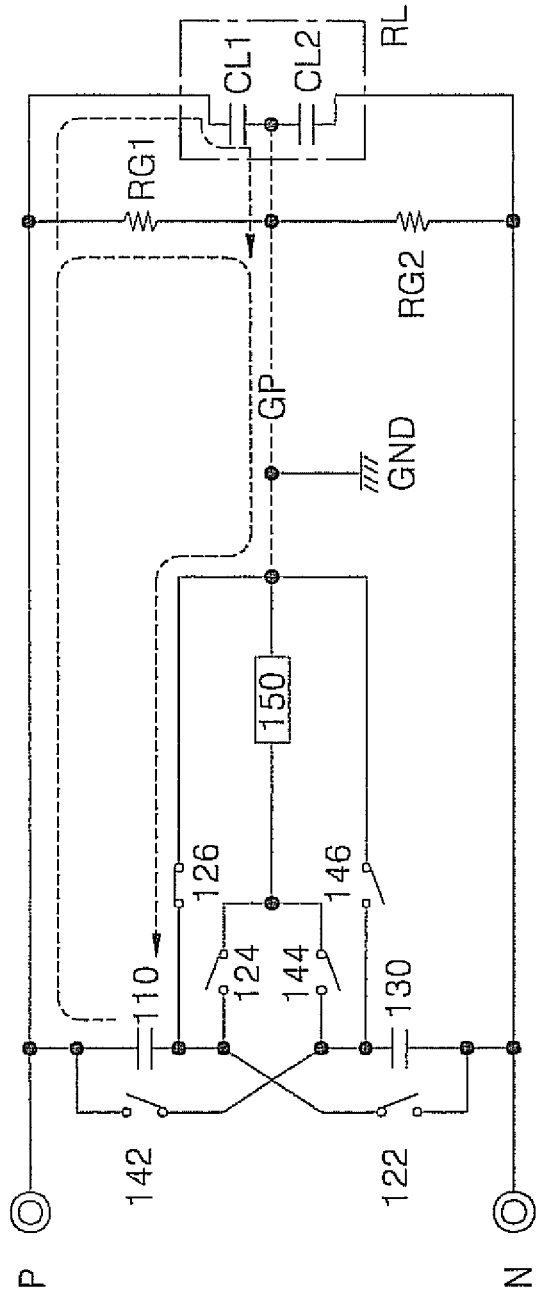
FIG. 8 is a diagram explaining an operation of charging a positive side capacitive component of a load in accordance with the embodiment of the present invention.

When the positive side measurement power is stored, the control unit 160 turns on the third switch 126 through a switching signal as shown in FIG. 8, such that the positive side capacitive component CL1 of the load RL is charged with the power of the positive side storage unit 110. At this time, the distributed capacitive component between the positive electric line P and the ground is also charged. Therefore, it is possible to minimize the influence of a capacitive ground leakage current caused by the distributed capacitive component and the capacitive component of the load in the next step of measuring a positive side ground leakage current.

TABLE 2

| | Switch | | | | | |
|---|---|---|---|---|---|---|
| | 122 | 124 | 126 | 142 | 144 | 146 |
| State | OFF | OFF | ON | OFF | OFF | OFF |

[Measuring Positive Side Ground Leakage Current—S130]

Figure 9:
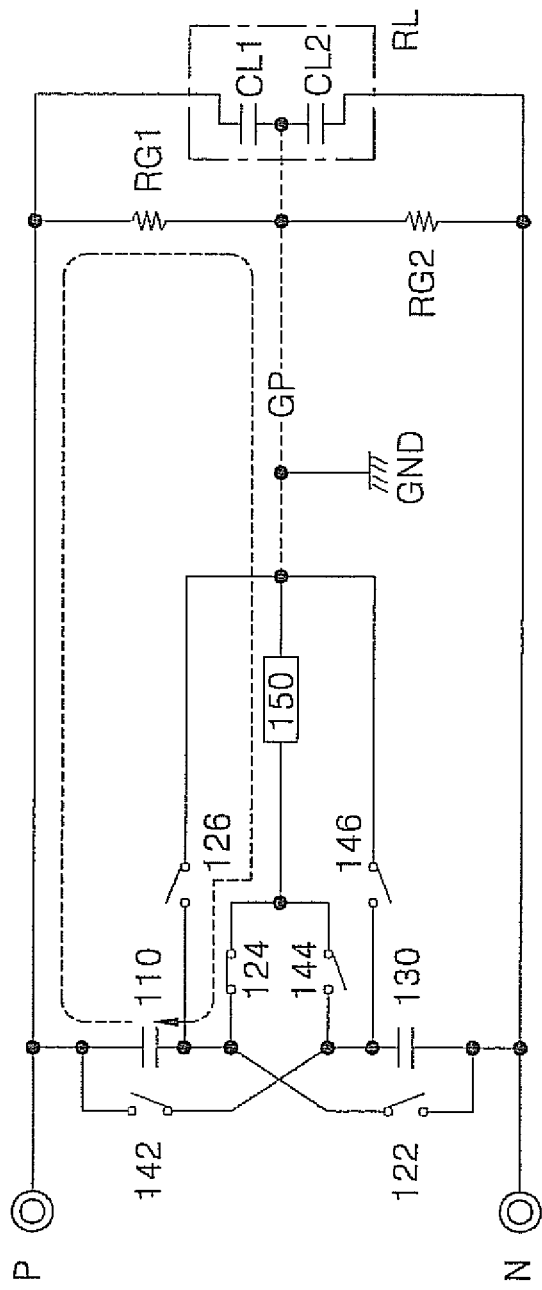
FIG. 9 is a diagram explaining an operation of measuring a positive side ground leakage current in accordance with the embodiment of the present invention.

Referring to FIG. 9, the control unit 160 turns on the second switch 124 to form a path where the positive side measurement power of the positive side storage unit 110 passes through the positive electric line P, the positive side ground resistor RG1, the ground path GP, and the measurement unit 120. The measurement unit 150 measures a current flowing in the path as the positive ground leakage current.

TABLE 3

| | Switch | | | | | |
|---|---|---|---|---|---|---|
| | 122 | 124 | 126 | 142 | 144 | 146 |
| State | OFF | ON | OFF | OFF | OFF | OFF |

[Storing Negative Side Measurement Power—S140]

Figure 10:
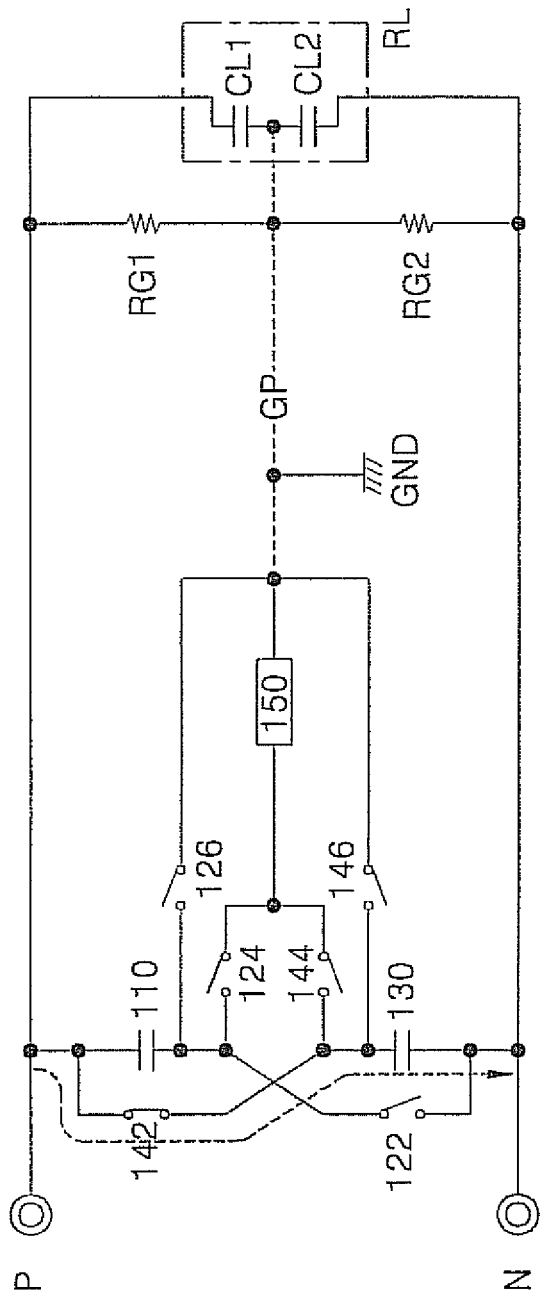
FIG. 10 is a diagram explaining an operation of storing negative side measurement power in accordance with the embodiment of the present invention.

Referring to FIG. 10, the control unit 160 applies a switching signal to the fourth switch 142 to store the negative side measurement power in the negative side storage unit 130.

TABLE 4

| | Switch | | | | | |
|---|---|---|---|---|---|---|
| | 122 | 124 | 126 | 142 | 144 | 146 |
| State | OFF | OFF | OFF | ON | OFF | OFF |

[Charging Negative Side Capacitive Component of Load—S150]

Figure 11:
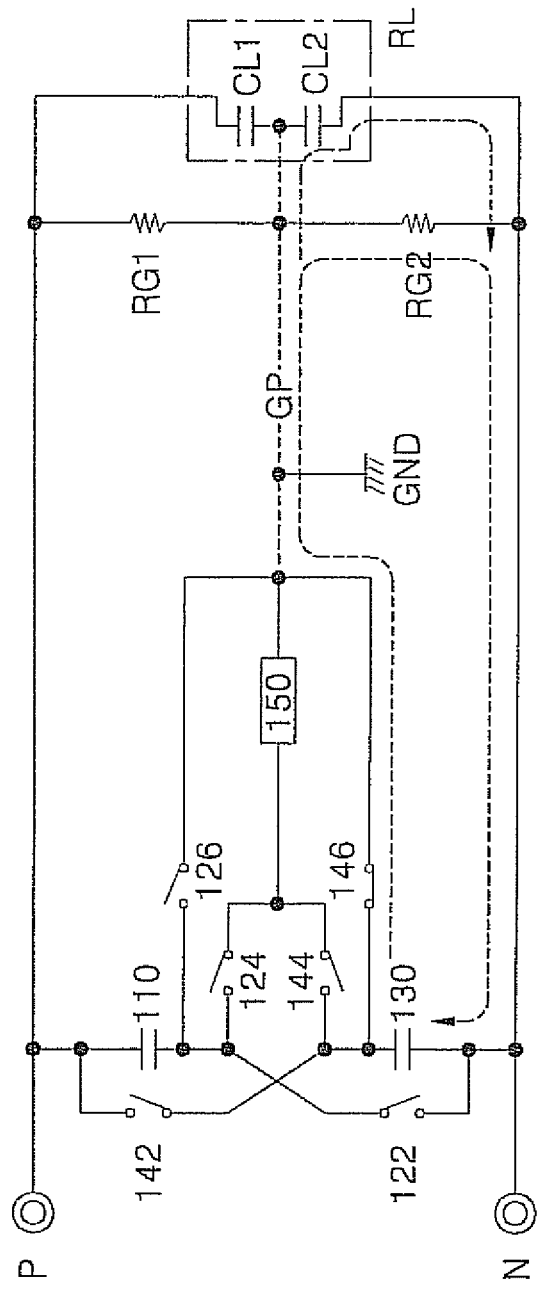
FIG. 11 is a diagram explaining an operation of charting a negative side capacitive component of a load in accordance with the embodiment of the present invention.

When the negative side measurement power is stored, the control unit 160 turns on the sixth switch 146 through a switching signal as shown in FIG. 11, such that the negative side measurement power of the negative side storage unit 130 is supplied to the load RL through the ground path GP, thereby charging the negative side capacitive component CL2 of the load. Accordingly, it is possible to minimize the influence of a capacitive leading peak current caused by the distributed capacitive component and the capacitive component of the load in the next step of measuring a negative side ground leakage current.

TABLE 5

| | Switch | | | | | |
|---|---|---|---|---|---|---|
| | 122 | 124 | 126 | 142 | 144 | 146 |
| State | OFF | OFF | OFF | OFF | OFF | ON |

[Measuring Negative Side Ground Leakage Current—S160]

Figure 12:
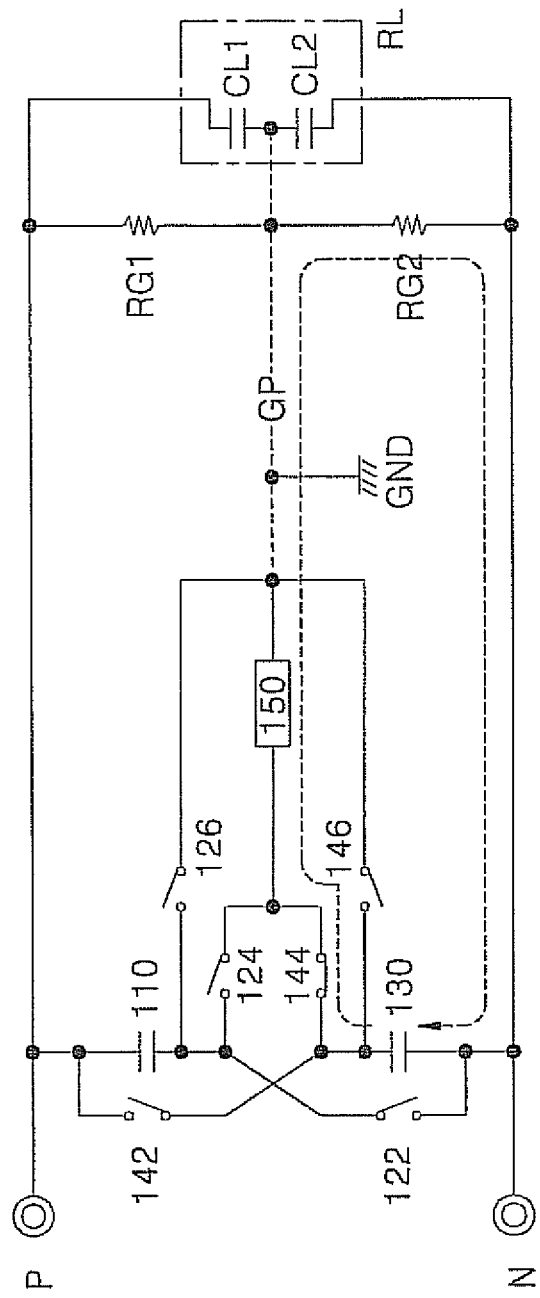
FIG. 12 is a diagram explaining an operation of a negative side ground leakage current in accordance with the embodiment of the present invention.

Referring to FIG. 12, the control unit 160 turns on the fifth switch 144 through a switching signal and forms a path where the negative side measurement power of the negative side storage unit 130 pass through the ground path GP, the negative side ground resistor RG2, the negative electric line N, and the measurement unit 150. The measurement unit 150 measures a current flowing in the path as the negative side ground leakage current.

TABLE 6

| | Switch | | | | | |
|---|---|---|---|---|---|---|
| | 122 | 124 | 126 | 142 | 144 | 146 |
| State | OFF | OFF | OFF | OFF | ON | OFF |

As described above, the ground leakage current measurement operation in accordance with the embodiment of the present invention is divided into the positive side ground leakage current measurement operation and the negative side ground leakage current measurement operation which are mutually exclusively performed. Accordingly, although ground faults simultaneously occur in the positive and negative electric lines or ground faults having the same ground resistance value simultaneously occur, it is possible to measure a ground leakage current. Furthermore, since the influences of the distributed capacitive component and the capacitive component of the load between the electric line and the ground are minimized before the ground leakage current measurement, it is possible to measure a pure resistive ground leakage current. The ground leakage current measured in such a manner is used to accurately calculate the positive side ground resistance value or negative side ground resistance value.

Hereinafter, referring to FIG. 13, a specific embodiment to which the above-described configuration of the present invention is applied will be described. The embodiment is only an example for explaining the industrial applicability of the present invention. Therefore, the detailed descriptions of specific functions of additional components will be omitted.

Figure 13:
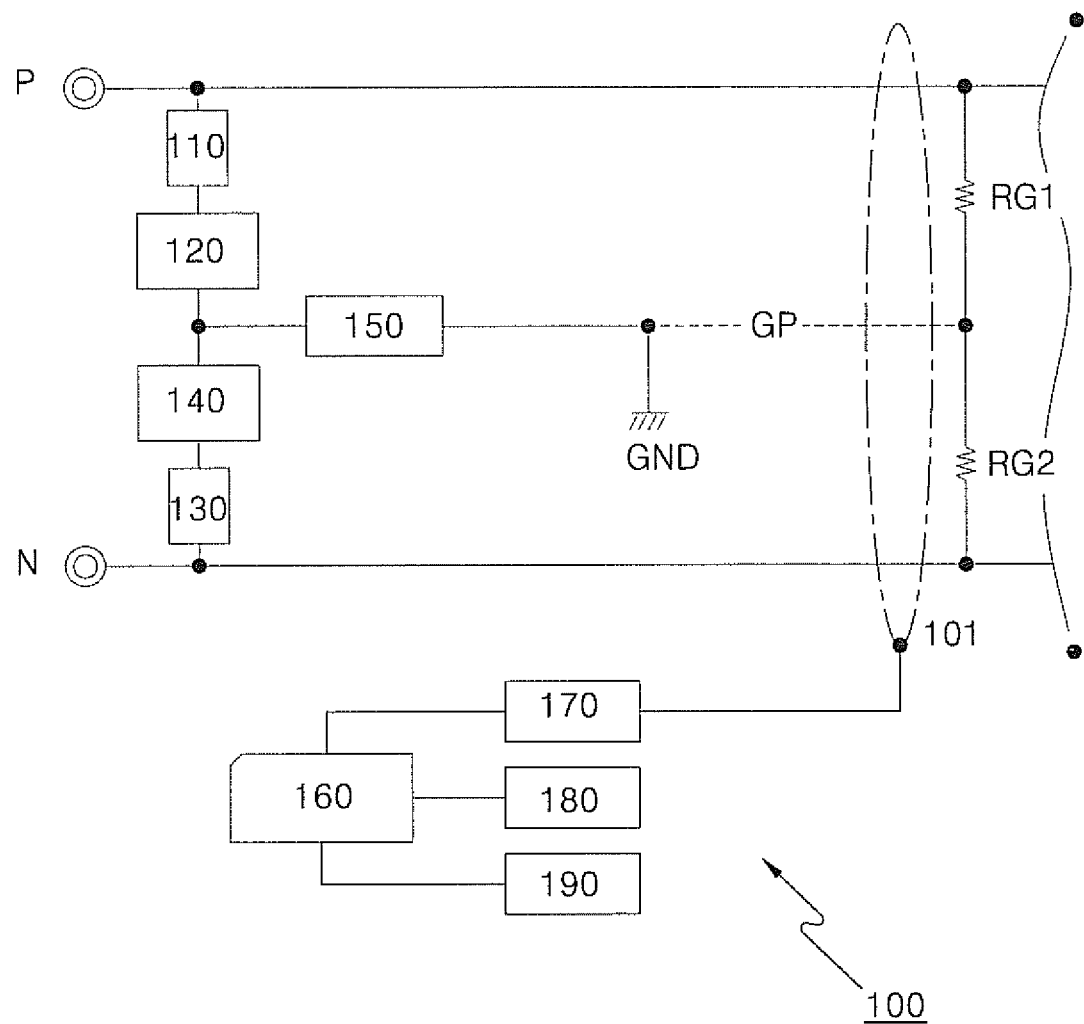
FIG. 13 is a diagram explaining a specific embodiment to which the present invention is applied.

Referring to FIG. 13, the ground leakage current measurement apparatus 100 may further include a ZCT 101, a signal detection unit 170, a display unit 180, and an alarm transmission unit 190. The signal detection unit 170, the display unit 180, and the alarm transmission unit 190 are controlled by the control unit 160.

Specifically, the ZCT 101 is a non-contact type sensor for measuring a ground leakage current of an electric line, and is installed at each diverging point of the electric line. The signal detection unit 170 detects a ground leakage current from a signal outputted from the ZCT 101. At this time, the ground leakage current is different from the above-described positive side and negative side ground leakage currents. The ground leakage current detected by the signal detection unit 170 is a current which occurs in a diverging point where the ZCT 101 is installed, that is, on a diverging electric line.

The display unit 180 visually outputs the overall control state of the apparatus 100, the ground leakage current value and the ground resistance value measured by the measurement unit 150, and the ground leakage current value detected by the signal detection unit 170. The alarm transmission unit 190 is an interface for transmitting related information during a ground fault to a remote manager terminal.

The ground leakage current detection apparatus 100 in accordance with the specific embodiment of the present invention has an advantage in that a separate signal generator does not need to be used to transmit a predetermined supervisory signal to an electric line, unlike the conventional ground leakage current detection apparatus. That is because the positive side measurement power or negative side measurement power which is momentarily supplied to the electric line is used as a supervisory signal at the above-described step S130 or S160 of measuring the positive side ground leakage current or negative side ground leakage current. That is, the ground leakage current measurement apparatus 100 in accordance with the embodiment of the present invention also includes a function of a signal generator which is driven by its own power.

While the present invention has been described with respect to the specific embodiments, it will be apparent to those skilled in the art that various changes and modifications may be made without departing from the spirit and scope of the invention as defined in the following claims.

What is claimed is:

1. A ground leakage current measurement apparatus in an ungrounded DC power system including positive and negative electric lines, the ground leakage current measurement apparatus comprising:
   a switching unit configured to perform switching to supply measurement power to a positive side ground resistor and a negative side ground resistor by using power of the electric lines;
   a measurement unit connected between the switching unit and a ground and configured to measure at least one of positive side and negative side ground leakage currents; and
   a control unit configured to control the switching unit to discriminate a positive side ground leakage current operation and a negative side ground leakage current operation of the measurement unit,
   wherein the switching unit comprises:
   a positive side storage section configured to store positive side measurement power from the power of the electric lines;
   a positive side switching section configured to perform switching to supply the positive side measurement power to the positive side ground resistor;
   a negative side storage section configured to store negative side measurement power from the power of the electric lines; and
   a negative side switching section configured to perform switching to supply the negative side measurement power to the negative side ground resistor,
   wherein the positive side switching section comprises:
   a first switch having one end connected to the negative electric line and the other end connected to one end of the positive side storage section connected to the positive electric line; and
   a second switch connected between the one end of the positive side storage section and one end of the measurement unit, and grounded through the measurement unit.

2. The ground leakage current measurement apparatus of claim 1, wherein the control unit controls the positive side switching section to supply the positive measurement power to a load before the positive side ground leakage current measurement operation of the measurement unit, thereby charging a positive side capacitive component of the load.

3. The ground leakage current measurement apparatus of claim 1, wherein the control unit controls the negative side switching section to supply the negative side measurement power to a load before the negative side ground leakage current measurement operation of the measurement unit, thereby charging a negative side capacitive component of the load.

4. The ground leakage current measurement apparatus of claim 1, further comprising a third switch connected to the one end of the positive side storage section and the other end of the measurement unit.

5. The ground leakage current measurement apparatus of claim 1, wherein the negative side switching section comprises:
 a fourth switch having one end connected to the positive electric line and the other end connected to one end of the positive side storage section connected to the negative electric line; and
 a fifth switch connected between one end of the negative side charging section and one end of the measurement unit and grounded through the measurement unit.

6. The ground leakage current measurement apparatus of claim 5, further comprising a sixth switch connected to the one end of the negative side storage section and the other end of the measurement unit.

* * * * *